(12) United States Patent
Kwon et al.

(10) Patent No.: US 9,450,567 B2
(45) Date of Patent: Sep. 20, 2016

(54) NOISE REMOVING CIRCUIT AND CURRENT SENSING UNIT INCLUDING THE SAME

(71) Applicant: SAMSUNG DISPLAY CO., LTD., Yongin, Gyeonggi-Do (KR)

(72) Inventors: Oh-Jo Kwon, Yongin (KR); Boo-Dong Kwak, Yongin (KR); Choong-Sun Shin, Yongin (KR); Hee-Sun Ahn, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 130 days.

(21) Appl. No.: 14/458,167

(22) Filed: Aug. 12, 2014

(65) Prior Publication Data

US 2015/0048881 A1 Feb. 19, 2015

(30) Foreign Application Priority Data

Aug. 19, 2013 (KR) .......................... 10-2013-0097731

(51) Int. Cl.
*G09G 3/00* (2006.01)
*H03H 19/00* (2006.01)
*G09G 3/32* (2016.01)

(52) U.S. Cl.
CPC .......... *H03H 19/004* (2013.01); *G09G 3/3233* (2013.01); *G09G 3/3258* (2013.01); *G09G 3/3291* (2013.01)

(58) Field of Classification Search
None
See application file for complete search history.

(56) References Cited

U.S. PATENT DOCUMENTS

2008/0191976 A1 8/2008 Nathan et al.
2009/0309818 A1 12/2009 Kim
(Continued)

FOREIGN PATENT DOCUMENTS

JP 2011-164135 8/2011
KR 10-2008-0017903 2/2008
KR 10-2009-0080269 7/2009

OTHER PUBLICATIONS

Chaji, G. Reza et al., "A Current-Mode Comparator for Digital Calibration of Amorphous Silicon AMOLED Displays", IEEE Transactions on Circuits and Systems II: Express Briefs, Jul. 2008, pp. 614-618, vol. 55, Issue 7, Abstract.

*Primary Examiner* — Tuan T Lam
(74) *Attorney, Agent, or Firm* — Lewis Roca Rothgerber Christie LLP

(57) ABSTRACT

A noise-removing circuit includes a first capacitor to charge a first voltage supplied to a first node during a first period in which a first switching control signal is supplied, a second capacitor to charge a second voltage supplied to a third node during the first period, a third capacitor to charge the first voltage during a second period in which a second switching control signal is supplied, and to charge the second voltage charged in the second capacitor as a third voltage during a third period in which a third switching control signal is supplied, a fourth capacitor to charge the second voltage during the second period, and to charge the first voltage charged in the first capacitor as a fourth voltage during the third period, and a differential amplifier to output a voltage difference between the third voltage and the fourth voltage.

7 Claims, 5 Drawing Sheets

(56) References Cited

U.S. PATENT DOCUMENTS

| | | |
|---|---|---|
| 2011/0130981 A1 | 6/2011 | Chaji et al. |
| 2012/0032940 A1* | 2/2012 | Mizukoshi ............ G09G 3/006 345/212 |
| 2014/0152642 A1* | 6/2014 | Kim ..................... G09G 3/3233 345/212 |
| 2015/0009204 A1* | 1/2015 | Chaji ................... G09G 3/3233 345/214 |
| 2015/0130780 A1* | 5/2015 | Kwon .................. G09G 3/3233 345/212 |
| 2015/0130866 A1* | 5/2015 | Bae ...................... G09G 3/3225 345/694 |
| 2015/0145754 A1* | 5/2015 | Yang .................... G09G 3/3233 345/76 |
| 2016/0034097 A1* | 2/2016 | Chae .................... G06F 3/044 345/173 |

* cited by examiner

NOISE REMOVING CIRCUIT AND CURRENT SENSING UNIT INCLUDING THE SAME

CROSS-REFERENCE TO RELATED APPLICATION

This application claims priority to and the benefit of Korean Patent Application No. 10-2013-0097731, filed on Aug. 19, 2013, in the Korean Intellectual Property Office, the entire contents of which are incorporated herein by reference in their entirety.

BACKGROUND

1. Field

An aspect of embodiments of the present invention relates to a noise-removing circuit and a current-sensing unit including the same.

2. Description of the Related Art

Recently, there have been developed various types of flat panel display devices capable of reducing the weight and volume of cathode ray tubes, which are disadvantages. The flat panel display devices include a liquid crystal display device, a field emission display device, a plasma display panel, an organic light emitting display device, and the like.

Among these flat panel display devices, the organic light emitting display device displays images using organic light emitting diodes that emit light through recombination of electrons and holes. The organic light emitting display device has a relatively fast response speed and is driven with relatively low power consumption. In a general organic light emitting display device, a driving transistor included in each pixel supplies current with an amplitude corresponding to a data signal, so that light is generated in an organic light emitting diode of the pixel.

SUMMARY

According to an aspect of the present invention, there is provided a noise-removing circuit including a first capacitor configured to charge a first voltage supplied to a first node during a first period in which a first switching control signal is supplied, a second capacitor configured to charge a second voltage supplied to a third node during the first period, a third capacitor configured to charge the first voltage supplied to the first node during a second period in which a second switching control signal is supplied, and configured to charge the second voltage charged in the second capacitor as a third voltage during a third period in which a third switching control signal is supplied, a fourth capacitor configured to charge the second voltage supplied to the third node during the second period, and configured to charge the first voltage charged in the first capacitor as a fourth voltage during the third period, and a differential amplifier configured to output a voltage difference between the third voltage charged in the third capacitor and the fourth voltage charged in the fourth capacitor.

The first, second, and third switching control signals may be progressively supplied and not overlap.

A voltage having a signal element for removing noise may be supplied through one of the first and third nodes during one of the first and second periods.

The first, second, third, and fourth capacitors may be commonly coupled to a second node and may be configured to receive an intermediate voltage.

The noise-removing circuit may further include a first switch coupled between the first node and the first capacitor, the first switch being configured to be turned on in response to the first switching control signal, a second switch coupled between the third node and the second capacitor, the second switch being configured to be turned on in response to the first switching control signal, a third switch coupled between the first node and the third capacitor, the third switch being configured to be turned on in response to the second switching control signal, a fourth switch coupled between the third node and the fourth capacitor, the fourth switch being configured to be turned on in response to the second switching control signal, a fifth switch coupled between a fifth node, which is located between the second switch and the second capacitor, and a sixth node, which is located between the third switch and the third capacitor, the fifth switch being configured to be turned on in response to the third switching control signal, and a sixth switch coupled between a fourth node, which is located between the first switch and the first capacitor, and a seventh node, which is located between the fourth switch and the fourth capacitor, the sixth switch being configured to be turned on in response to the third switching control signal.

The noise-removing circuit may further include a first switch coupled between the first node and the first capacitor, the first switch being configured to be turned on in response to the first switching control signal, a second switch coupled between the third node and the second capacitor, the second switch being configured to be turned on in response to the first switching control signal, a third switch coupled between the first node and the third capacitor, the third switch being configured to be turned on in response to the second switching control signal, a fourth switch coupled between the third node and the fourth capacitor, the fourth switch being configured to be turned on in response to the second switching control signal, a fifth switch coupled between a fourth node, which is located between the first switch and the first capacitor, and a sixth node, which is located between the third switch and the third capacitor, the fifth switch being configured to be turned on in response to the third switching control signal, and a sixth switch coupled between a fifth node, which is located between the second switch and the second capacitor, and a seventh node, which is located between the fourth switch and the fourth capacitor, the sixth switch being configured to be turned on in response to the third switching control signal.

According to an aspect of the present invention, there is provided a current-sensing unit including a selection unit configured to respectively couple two data lines among a plurality of data lines to a first sensing line and a second sensing line in response to a line selection signal, a current-integrating unit configured to generate a first voltage by integrating a first current supplied from the first sensing line, and configured to generate a second voltage by integrating a second current supplied through the second sensing line, a noise-removing circuit configured to output a signal voltage having noise removed therefrom by using the first and second voltages, and a comparison unit configured to compare the signal voltage with a reference voltage, and configured to output a corresponding comparison result signal.

The two data lines may include adjacent data lines.

The two data lines may be coupled to pixels emitting a same color.

The current-integrating unit may include a first current integrator configured to generate the first voltage by integrating the first current, and a second current integrator configured to generate the second voltage by integrating the second current.

Each of the first and second current integrators may adjust amplitudes of the first and second voltages by adjusting internal capacitance in response to a capacitance control signal.

The noise-removing circuit may include a first capacitor configured to charge the first voltage during a first period in which a first switching control signal is supplied, a second capacitor configured to charge the second voltage during the first period, a third capacitor configured to charge the first voltage during a second period in which a second switching control signal is supplied, and configured to charge the second voltage charged in the second capacitor as a third voltage during a third period in which a third switching control signal is supplied, a fourth capacitor configured to charge the second voltage during the second period, and configured to charge the first voltage charged in the first capacitor as a fourth voltage during the third period, and a differential amplifier configured to output a voltage difference between the third voltage charged in the third capacitor and the fourth voltage charged in the fourth capacitor.

The noise-removing circuit may include a first voltage buffer configured to buffer the third voltage charged in the third capacitor, and configured to supply the buffered third voltage to a first input terminal of the differential amplifier, and a second voltage buffer configured to buffer the fourth voltage charged in the fourth capacitor, and configured to supply the buffered fourth voltage to a second input terminal of the differential amplifier.

BRIEF DESCRIPTION OF THE DRAWINGS

Example embodiments of the present invention will be described more fully hereinafter with reference to the accompanying drawings. However, the described embodiments may be embodied in different forms, and should not be construed as strictly limited to the embodiments set forth herein. Rather, these embodiments are provided so that the present disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it may be the only element between the two elements, or one or more intervening elements may be present. Like reference numerals refer to like elements throughout.

DETAILED DESCRIPTION

Figure 1:
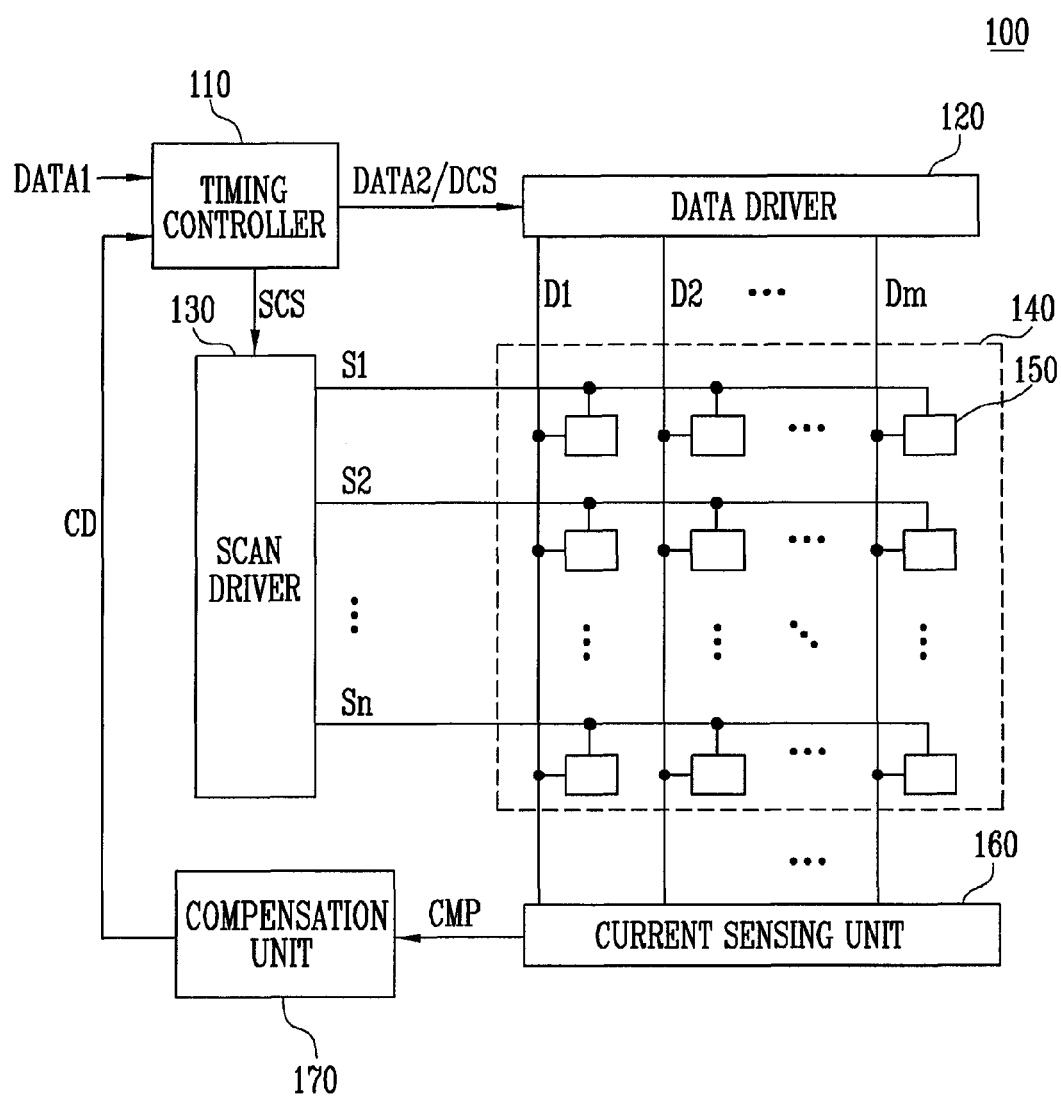
FIG. 1 is a block diagram illustrating an organic light emitting display device according to an embodiment of the present invention.

Hereinafter, certain exemplary embodiments according to the present invention will be described with reference to the accompanying drawings. Here, when a first element is described as being coupled to a second element, the first element may be not only directly coupled to the second element, but may also be indirectly coupled to the second element via a third element. Further, some of the elements that are not essential to the complete understanding of the invention are omitted for clarity. Also, like reference numerals refer to like elements throughout. Additionally, terms such as "first," "second," and "third," as used in the claims, are merely used to delineate elements, and do not necessarily reflect the total number of elements present in the various embodiments of the present invention.

FIG. 1 is a block diagram illustrating an organic light emitting display device according to an embodiment of the present invention.

Referring to FIG. 1, the organic light emitting display device 100 according to the present embodiment includes a timing controller 110, a data driver 120, a scan driver 130, a display unit 140, a current-sensing unit 160, and a compensation unit 170.

The timing controller 110 controls operations of the data driver 120 and the scan driver 130, in response to a synchronization signal supplied from outside of the organic light emitting display device 100. Specifically, the timing controller 110 generates a data driving control signal DCS and supplies the generated data driving control signal DCS to the data driver 120. The timing controller 110 also generates a scan driving control signal SCS and supplies the generated scan driving control signal SCS to the scan driver 130.

The timing controller 110 converts a first data DATA1 supplied from the outside into a second data DATA2, in response to a compensation data CD output from the compensation unit 170, and supplies the converted second data DATA2 to the data driver 120.

In response to the data driving control signal DCS output from the timing controller 110, the data driver 120 realigns the second data DATA2 supplied from the timing controller 110, and supplies the realigned second data DATA2 to data lines D1 to Dm as data signals.

In response to the scan driving control signal SCS output from the timing controller 110, the scan driver 130 progressively supplies a scan signal to scan lines S1 to Sn The display unit 140 includes pixels 150 respectively located at crossing regions of respective ones of the data lines D1 to Dm and the scan lines S1 to Sn. In the present embodiment, the data lines D1 to Dm are arranged along vertical lines, and the scan lines S1 to Sn are arranged along horizontal lines.

Each pixel 150 emits light with luminance corresponding to a data signal supplied through a corresponding one of the data lines D1 to Dm when a scan signal is supplied to a corresponding one of the scan lines S1 to Sn.

A pixel selected as a sensing target among the pixels 150 supplies current to the current-sensing unit 160 through a corresponding data line among the data lines D1 to Dm during a portion of a period in which the current-sensing unit 160 senses the current. Specifically, the timing controller 110 selects, as a sensing target, at least one of the pixels 150, and supplies a sensing signal via the scan driver 130 to the pixel selected as the sensing target. In response to the sensing signal, the pixel selected as the sensing target supplies current to the current-sensing unit 160 through a corresponding data line among the data lines D1 to Dm.

The current-sensing unit 160 senses current supplied from each pixel 150, thereby sensing degradation of each pixel 150. The current-sensing unit 160 senses current supplied from the corresponding data line coupled to the pixel selected as the sensing target by removing a noise element of the current, and by using current supplied from another data line for comparison, so that it is possible to relatively accurately sense degradation of the pixel selected as the sensing target. The current-sensing unit 160 outputs a comparison result signal CMP to the compensation unit 170 according to the amplitude of current supplied from each pixel 150.

The structure and operation of the current-sensing unit 160 will be described in detail with reference to FIGS. 2 to 9.

In response to the comparison result signal CMP output from the sensing unit 160, the compensation unit 170 generates and then supplies a compensation data CD to the timing controller 110.

Figure 2:
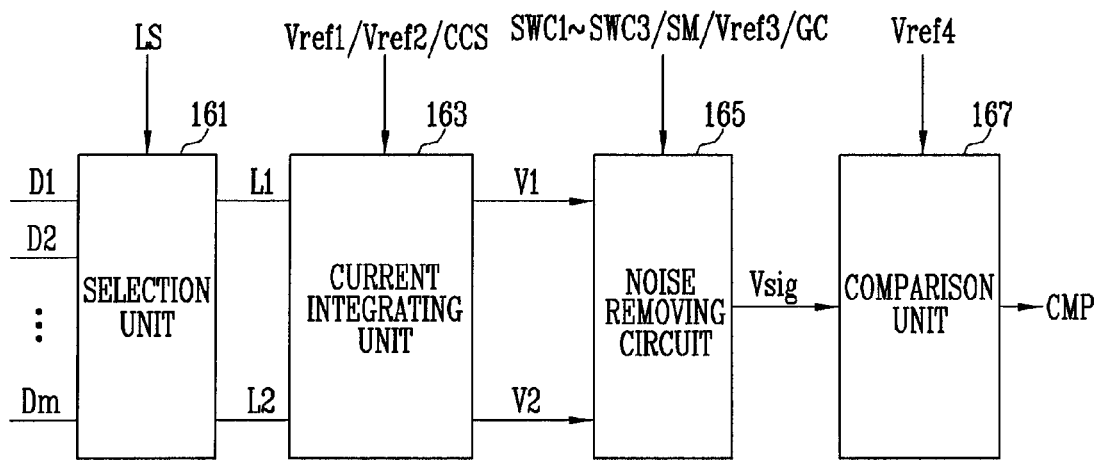
FIG. 2 is a diagram illustrating in detail an embodiment of a current-sensing unit shown in FIG. 1.
Figure 3:
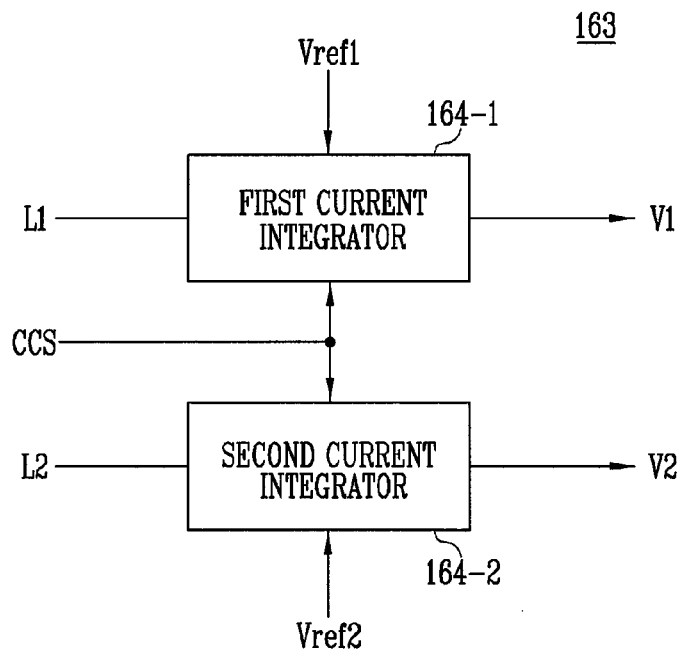
FIG. 3 is a diagram illustrating in detail a current-integrating unit shown in FIG. 2.
Figure 4:
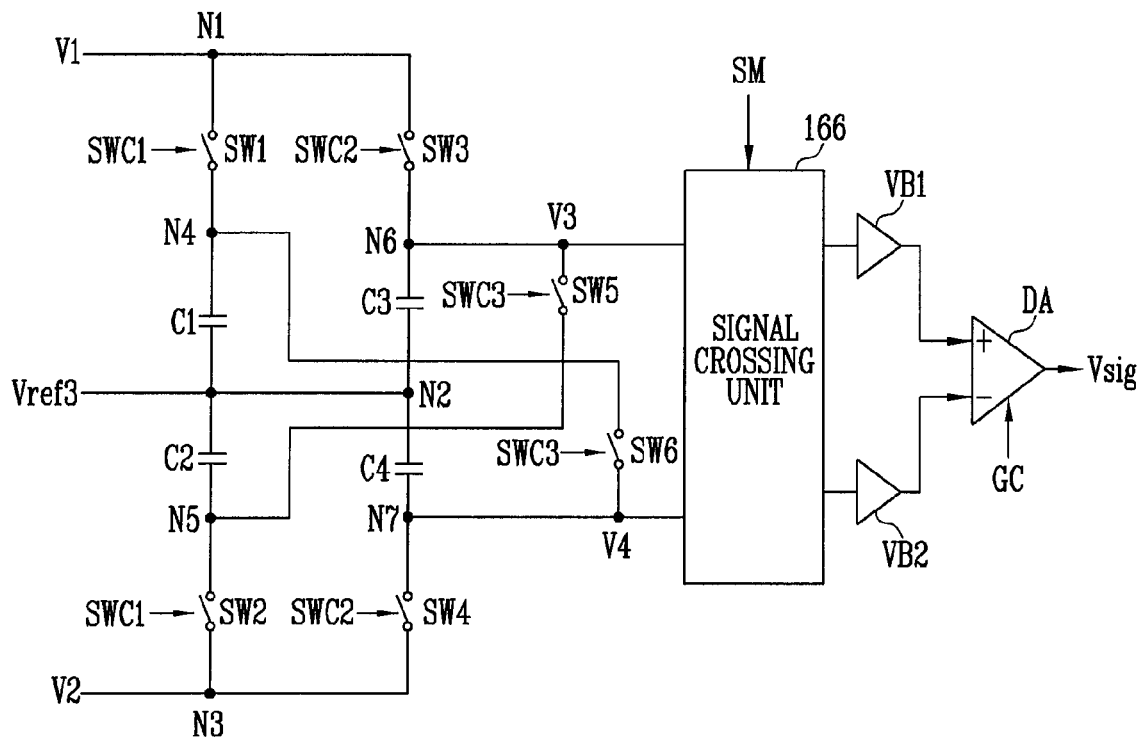
FIG. 4 is a circuit diagram illustrating in detail a noise-removing circuit shown in FIG. 2.
Figure 5:
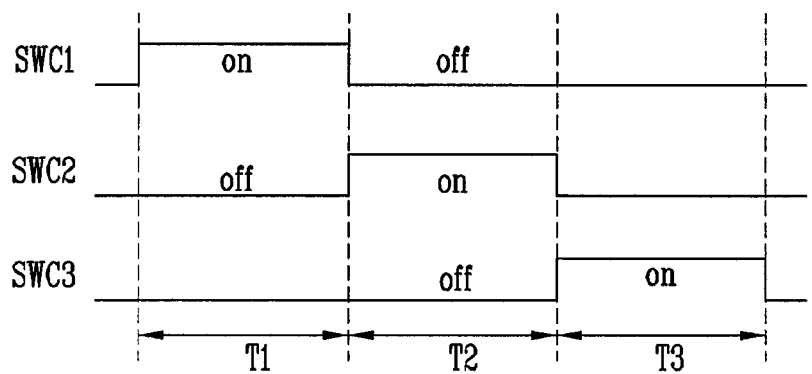
FIG. 5 is a timing diagram of switching control signals supplied to the noise-removing circuit shown in FIG. 4.

FIG. 2 is a diagram illustrating in detail an embodiment of the current-sensing unit shown in FIG. 1. FIG. 3 is a diagram illustrating in detail a current-integrating unit shown in FIG. 2. FIG. 4 is a circuit diagram illustrating in detail a noise-removing circuit shown in FIG. 2. FIG. 5 is a timing diagram of switching control signals supplied to the noise-removing circuit shown in FIG. 4.

Referring to FIGS. 1 to 5, the current-sensing unit 160 includes a selection unit 161, a current-integrating unit 163, a noise-removing circuit 165, and a comparison unit 167.

The selection unit 161 allows two data lines among the data lines D1 to Dm to be coupled to first and second sensing lines L1 and L2 in response to a line selection signal LS. For example, the selection unit 161 may allow one of the two data lines that is coupled to a pixel selected as a sensing target to be coupled to the first sensing line L1, and may allow the other data line to be coupled to the second sensing line L2.

According to an embodiment of the present invention, the selection unit 161 may allow adjacent data lines to be coupled to the first and second sensing lines L1 and L2. Because the adjacent data lines include similar noise elements, by selecting the adjacent data lines, the selection unit 161 can more efficiently remove noise.

According to another embodiment of the present invention, the selection unit 161 may allow data lines that are coupled to pixels emitting light of the same color to also be coupled to the first and second sensing lines L1 and L2. Since the data lines, which are coupled to pixels emitting light of the same color, include similar noise elements, the selection unit 161 selects such data lines to more efficiently remove noise.

The current-integrating unit 163 generates a first voltage V1 by integrating a first current supplied through the first sensing line L1. The current-integrating unit 163 generates a second voltage V2 by integrating a second current supplied through the second sensing line L2. As shown in FIG. 3, the current-integrating unit 163 includes a first current integrator 164-1 and a second current integrator 164-2.

The first current integrator 164-1 supplies a first intermediate reference voltage Vref1 to the data line coupled to the first sensing line L1 by the selection unit 161 before current integration is started. The data line coupled to the first sensing line L1 supplies a first current, which corresponds to a noise element, to the first current integrator 164-1 by means of the charged first intermediate reference voltage Vref1. The first current integrator 164-1 generates the first voltage V1 by integrating the first current supplied through the first sensing line L1.

The second current integrator 164-2 supplies a second intermediate reference voltage Vref2 to the data line coupled to the second sensing line L2 by the selection unit 161 before current integration is started. The data line coupled to the second sensing line L2 supplies a second current, which corresponds to a noise element, to the second current integrator 164-2 by means of the charged second intermediate reference voltage Vref2. The second current integrator 164-2 generates the second voltage V2 by integrating the second current supplied through the second sensing line L2.

Each of the first, and second current integrators 164-1 and 164-2 adjusts internal capacitance in response to a capacitance control signal CCS. As the capacitance is adjusted, it is possible to adjust the amplitude of the first voltage V1 generated by the first current integrator 164-1, and to adjust the amplitude of the second voltage V2 generated by the second current integrator 164-2. The capacitance control signal CCS can be adjusted according to the amplitudes of the first and second voltages V1 and V2.

As shown in FIG. 4, the noise-removing circuit 165 supplies a signal voltage Vsig, which has noise removed therefrom, to the comparison unit 167 using the first and second voltages V1 and V2 supplied from the current-integrating unit 163. The noise-removing circuit 165 includes a plurality of switches SW1 to SW6, a plurality of capacitors C1 to C4, and a differential amplifier DA.

The first switch SW1 is coupled between a fourth node and a first node N1, the first node N1 receiving the first voltage V1 supplied from the current-integrating unit 163. The second switch is coupled between a fifth node N5 and a third node N3, the third node N3 receiving the second voltage V2 supplied from the current-integrating unit 163. The first and second switches SW1 and SW2 are turned on in response to a first switching control signal SWC1 supplied during a first period T1 (see FIG. 5).

The third switch SW3 is coupled between the first node N1 and a sixth node N6. The fourth switch SW4 is coupled between the third node N3 and a seventh node N7. The third and fourth switches SW3 and SW4 are turned on in response to a second switching control signal SWC2 supplied during a second period T2.

The fifth switch SW5 is coupled between the fifth node N5 and the sixth node N6. The sixth switch SW6 is coupled between the fourth node N4 and the seventh node N7. The fifth and sixth switches SW5 and SW6 are turned on in response to a third switching control signal SWC3 supplied during a third period T3.

The first capacitor C1 is coupled between the fourth node N4 and a second node N2, wherein an intermediate voltage Vref3 is supplied to the second node N2. The second capacitor C2 is coupled between the second node N2 and the fifth node N5. The third capacitor C3 is coupled between the second node N2 and the sixth node N6. The fourth capacitor C4 is coupled between the second node N2 and the seventh node N7.

The first capacitor C1 charges the first voltage V1 supplied from the current-integrating unit 163, and the second capacitor C2 charges the second voltage V2 supplied from the current-integrating unit 163, during the first period T1 in which the first switching control signal SWC1 is supplied. The third capacitor C3 charges the first voltage V1 supplied from the current-integrating unit 163 during the second period T2 in which the second switching control signal SWC2 is supplied, and also charges the voltage charged in the second capacitor C2 during the third period T3 in which the third switching control signal SWC3 is supplied. The fourth capacitor C4 charges the second voltage V2 supplied from the current-integrating unit 163 during the second period T2 in which the second switching control signal SWC2 is supplied, and also charges the voltage charged in the first capacitor C1 during the third period T3 in which the third switching control signal SWC3 is supplied.

The voltage having a signal element for removing noise may be any one of the first and second voltages V1 and V2 supplied during any one of the first and second periods T1 and T2. That is, the timing controller 110 supplies a sensing signal to a pixel selected as a sensing target during any one of the first and second periods T1 and T2. Thus, the pixel selected as the sensing target supplies current to the current-sensing unit 160 during the one of the first and second periods T1 and T2.

For example, and for convenience of illustration, assume the voltage having the signal element for removing the noise is the first voltage V1 supplied from the current-integrating unit 163 during the second period T2 in which the second switching control signal SWC2 is supplied.

During the first period T1, the first and second voltages V1 and V2 may be represented by the following equations.

$$V1\_1 = Leak1 + Noise1 \qquad \text{Equation 1}$$

$$V2\_1 = Leak2 + Noise1 \qquad \text{Equation 2}$$

Here, V1_1 denotes the first voltage V1 supplied from the current-integrating unit 163 during the first period T1, and V2_1 denotes the second voltage V2 supplied from the current-integrating unit 163 during the first period T1. Leak1 denotes a noise element caused by leakage current of a data line coupled to the first sensing line L1, and Leak2 denotes a noise element caused by leakage current of a data line coupled to the second sensing line L2. Noise 1 denotes a noise element which commonly occurs during the first period T1.

The voltage V1_1 is charged in the first capacitor C1, and the voltage V2_1 is charged in the second capacitor C2.

During the second period T2, the first and second voltages V1 and V2 may be represented by the following equations.

$$V1\_2 = Vsig + Leak1 + Noise2 \qquad \text{Equation 3}$$

$$V2\_2 = Leak2 + Noise2 \qquad \text{Equation 4}$$

Here, V1_2 denotes the first voltage V1 supplied from the current-integrating unit 163 during the second period T2, and V2_2 denotes the second voltage V2 supplied from the current-integrating unit 163 during the second period T2. Noise2 denotes a noise element which commonly occurs during the second period T2.

The voltage V1_2 is charged in the third capacitor C3, and the voltage V2_2 is charged in the fourth capacitor C4.

Subsequently, the fifth and sixth switches SW5 and SW6 are turned on during the third period T3. When the plurality of capacitors C1 to C4 have the same capacitance, the third and fourth voltages V3 and V4 respectively charged in the third and fourth capacitors C3 and C4 after the third period T3 may be represented by the following equations.

$$V3 = \frac{Vsig + Leak1 + Leak2 + Noise1 + Noise2}{2} \qquad \text{Equation 5}$$

$$V4 = \frac{Leak1 + Leak2 + Noise1 + Noise2}{2} \qquad \text{Equation 6}$$

The differential amplifier DA supplies the voltage difference between the third and fourth voltages V3 and V4 to the comparison unit 167 as the signal voltage Vsig. Specifically, in response to a gain control signal GC, the differential amplifier DA amplifies the voltage difference between the third and fourth voltages V3 and V4, and supplies the amplified voltage difference to the comparison unit 167 as the signal voltage Vsig.

The noise-removing circuit 165 may further include a plurality of voltage buffers VB1 and VB2, although embodiments of the present invention include a noise-removing circuit without voltage buffers. The first voltage buffer VB1 buffers the third voltage V3 charged in the third capacitor C3, and supplies the buffered third voltage V3 to a first input terminal of the differential amplifier DA. The second voltage buffer VB2 buffers the fourth voltage V4 charged in the fourth capacitor C4, and supplies the buffered fourth voltage V4 to a second input terminal of the differential amplifier DA.

The noise-removing circuit 165 may further include a signal-crossing unit 166. In response to a sensing mode control signal SM, the signal-crossing unit 166 supplies one of the third and fourth voltages V3 and V4 to the first input terminal of the differential amplifier DA (or to the first voltage buffer VB1), and supplies the other of the third and fourth voltages V3 and V4 to the second input terminal of the differential amplifier DA (or to the second voltage buffer VB2).

When a characteristic of a driving transistor of a pixel is sensed, current flows in the current-sensing unit 160 from the pixel. When a characteristic of an organic light emitting diode of the pixel is sensed, current flows in the pixel from the current-sensing unit 160. Therefore, when the signal-crossing unit 166 does not exist, the signal voltage Vsig output from the noise-removing circuit 165 may have a positive or negative value. The signal-crossing unit 166 allows the third and fourth voltages V3 and V4 to cross each other in response to the sensing mode control signal SM, so that the polarity of the signal voltage Vsig output from the noise-removing circuit 165 can be consistently maintained as either positive or negative.

As shown in FIG. 2, the comparison unit 167 compares the signal voltage Vsig supplied from the noise-removing circuit 165 with a reference voltage Vref4, and, as shown in FIG. 1, supplies a comparison result signal CMP to the compensation unit 170 according to the compared result.

Figure 6:
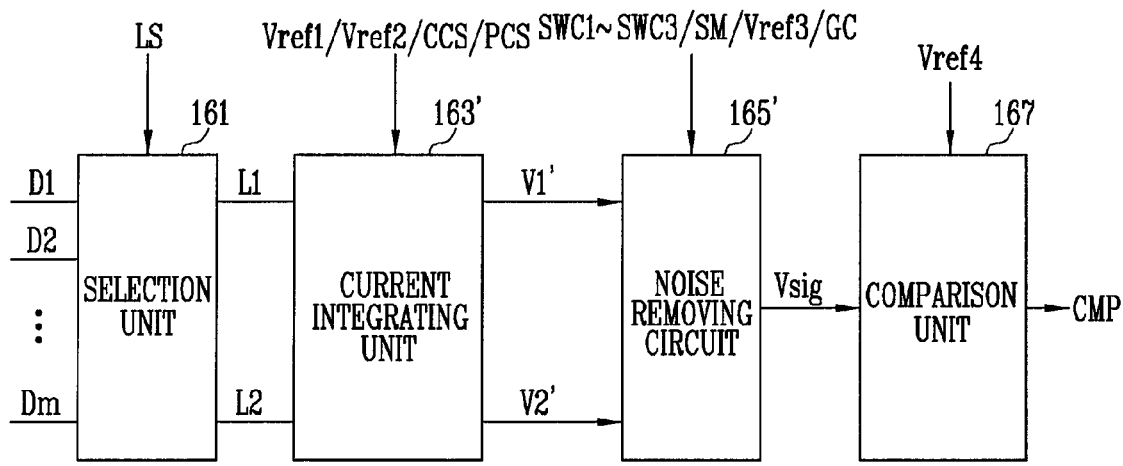
FIG. 6 is a diagram illustrating in detail another embodiment of the current-sensing unit shown in FIG. 1 according to another embodiment of the present invention.
Figure 7:
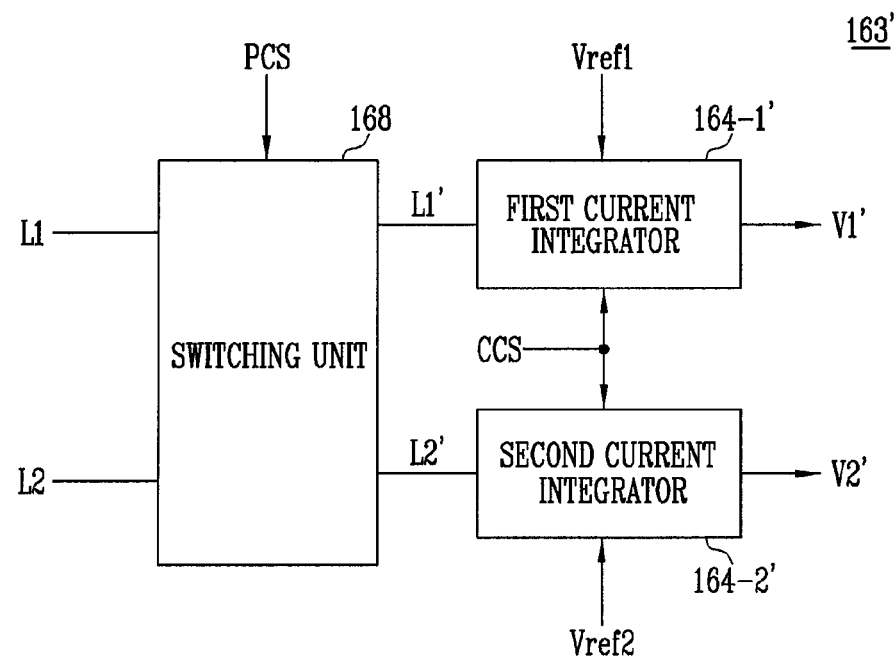
FIG. 7 is a diagram illustrating in detail a current-integrating unit shown in FIG. 6.
Figure 8:
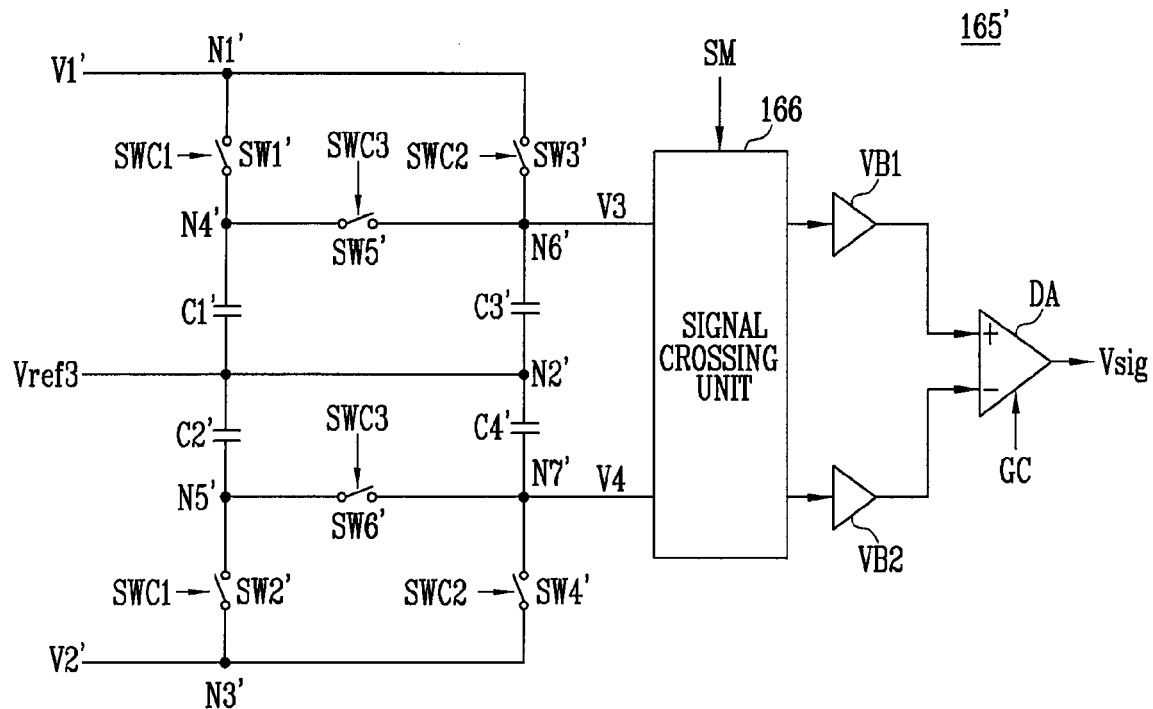
FIG. 8 is a circuit diagram illustrating in detail a noise-removing circuit shown in FIG. 7.
Figure 9:
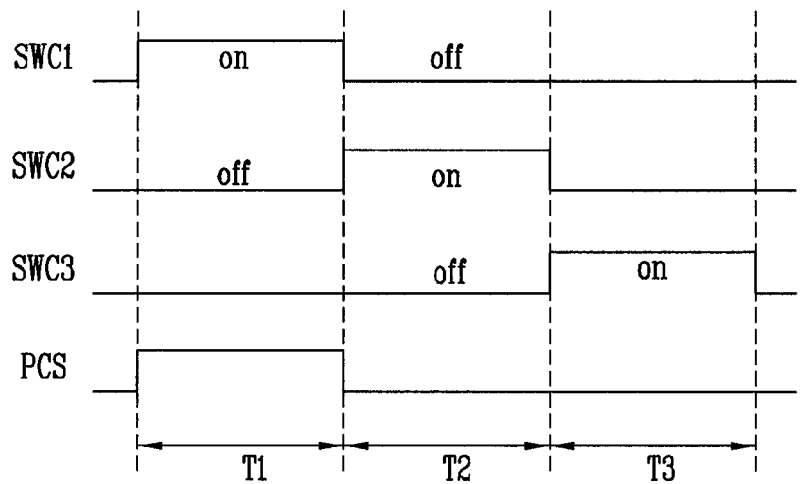
FIG. 9 is a timing diagram of switching control signals supplied to the noise-removing circuit shown in FIG. 8.

FIG. 6 is a diagram illustrating in detail another embodiment of the current-sensing unit shown in FIG. 1 according to another embodiment of the present invention. FIG. 7 is a diagram illustrating in detail a current-integrating unit shown in FIG. 6. FIG. 8 is a circuit diagram illustrating in detail a noise-removing circuit shown in FIG. 7. FIG. 9 is a timing diagram of switching control signals supplied to the noise-removing circuit shown in FIG. 8.

Referring to FIGS. 6 to 9, the current-sensing unit 160' includes a selection unit 161, a current-integrating unit 163', a noise-removing circuit 165', and comparison unit 167. The functions and operations of the selection unit 161 and the comparison unit 167 shown in FIG. 6 are substantially identical to the selection unit 161 and the comparison unit 167 shown in FIG. 2. Accordingly, further detailed descriptions of the selection unit 161 and the comparison unit 167 will be omitted. The embodiment described with reference to FIGS. 2 to 5 is substantially identical to the present embodiment described with reference to FIGS. 6 to 9, with the exception of those portions particularly described differently with reference to FIGS. 6 to 9.

The current-integrating unit 163' generates a first voltage V1' by integrating a first current supplied through a first sensing line L1 during a first period T1, and generates the first voltage V1' by integrating a second current supplied through a second sensing line L2 during a second period T2. The current-integrating unit 163' generates a second voltage V2' by integrating the second current supplied through the second sensing line L2 during the first period T1, and generates the second voltage V2' by integrating the first current supplied through the first sensing line L1 during the second period T2. That is, the first voltage V1' during the first period T1 and the second voltage V2' during the second period T2 correspond to the first sensing line L1, and the second voltage V2' during the first period T1 and the first voltage V1' during the second period T2 correspond to the second sensing line L2.

The current-integrating unit 163' includes a switching unit 168, a first current integrator 164-1', and a second current integrator 164-2'.

In response to a polarity control signal PCS, the switching unit 168 allows one of the first and second sensing lines L1 and L2 to be coupled to the first current integrator 164-1', and allows the other of the first and second sensing lines L1 and L2 to be coupled to the second current integrator 164-2'.

Specifically, during the first period T1, the switching unit 168 supplies the first current supplied through the first sensing line L1 to the first current integrator 164-1' and supplies the second current supplied through the second sensing line L2 to the second current integrator 164-2'. During the second period T2, the switching unit 168 supplies the second current supplied through the second sensing line L2 to the first current integrator 164-1' and supplies the first current supplied through the first sensing line L1 to the second current integrator 164-2'.

The first current integrator 164-1' generates the first voltage V1' by integrating the first current supplied through the first sensing line L1 during the first period T1, and generates the first voltage V1' by integrating the second current supplied through the second sensing line L2 during the second period T2. The second current integrator 164-2' generates the second voltage V2' by integrating the second current supplied through the second sensing line L2 during the first period T1, and generates the second voltage V2' by integrating the first current supplied through the first sensing line L1 during the second period T2.

The noise-removing circuit 165' supplies a signal voltage Vsig, which has noise removed therefrom, to the comparison unit 167 using the first and second voltages V1' and V2' supplied from the current-integrating unit 163'. As shown in FIG. 8, the noise-removing circuit 165' of the present embodiment includes a plurality of switches SW1' to SW6', a plurality of capacitors C1' to C4', and a differential amplifier DA.

The first switch SW1' is coupled between a fourth node N4' and a first node N1', the first node N1' receiving the first voltage V1' supplied from the current-integrating unit 163'. The second switch SW2' is coupled between a fifth node N5' and a third node N3', the third node N3' receiving the second voltage V2' supplied from the current-integrating unit 163'. The first and second switches SW1' and SW2' are turned on in response to a first switching control signal SWC1 supplied during the first period T1 (see FIG. 9).

The third switch SW3' is coupled between the first node N1' and a sixth node N6'. The fourth switch SW4' is coupled between the third node N3' and a seventh node N7'. The third and fourth switches SW3' and SW4' are turned on in response to a second switching control signal SWC2 supplied during the second period T2.

The fifth switch SW5' is coupled between the fourth and sixth nodes N4' and N6'. The sixth switch SW6' is coupled between the fifth and seventh nodes N5' and N7'. The fifth and sixth switches SW5' and SW6' are turned on in response to a third switching control signal SWC3 supplied during a third period T3.

The first capacitor C1' is coupled between the fourth node N4' and a second node N2' to which an intermediate voltage Vref3 is supplied. The second capacitor C2' is coupled between the second and fifth nodes N2' and N5'. The third capacitor C3' is coupled between the second and sixth nodes N2' and N6'. The fourth capacitor C4' is coupled between the second and seventh nodes N2' and N7'.

The first capacitor C1' charges the first voltage V1' supplied from the current-integrating unit 163' during the first period T1 in which the first switching control signal SWC1 is supplied. The second capacitor C2' charges the second voltage V2' supplied from the current-integrating unit 163' during the first period T1 in which the first switching control signal SWC1 is supplied. The third capacitor C3' charges the first voltage V1' supplied from the current integrating circuit 163' during the second period T2 in which the second switching control signal SWC2 is supplied, and also charges the voltage charged in the first capacitor C1' during third period T3 in which the third switching control signal SWC3 is supplied. The fourth capacitor C4' charges the second voltage V2' supplied from the current integrating circuit 163' during the second period T2 in which the second switching control signal SWC2 is supplied, and also charges the voltage charged in the second capacitor C2' during the third period T3 in which the third switching control signal SWC3 is supplied.

The voltage having a signal element for removing noise may be any one of the first and second voltages V1' and V2' supplied during any one of the first and second periods T1 and T2. That is, the timing controller 110 supplies a sensing signal to a pixel selected as a sensing target during any one of the first and second periods T1 and T2. Thus, the pixel selected as the sensing target supplies current to the current-sensing unit 160 during the one of the first and second periods T1 and T2.

For example, and for convenience of illustration, assume that the voltage having the signal element for removing the noise is the first voltage V1' supplied from the current-integrating unit 163' during the second period T2 in which the second switching control signal SWC2 is supplied.

During the first period T1, the first and second voltages V1' and V2' may be represented by the following equations.

$$V1\_1' = \text{Leak1} + \text{Noise1} \qquad \text{Equation 7}$$

$$V2\_1' = \text{Leak2} + \text{Noise1} \qquad \text{Equation 8}$$

Here, V1_1' denotes the first voltage V1' supplied from the current-integrating unit 163' during the first period T1, and V2_1' denotes the second voltage V2' supplied from the current-integrating unit 163' during the first period T1.

The voltage V1_1' is charged in the first capacitor C1', and the voltage V2_1' is charged in the second capacitor C2'.

During the second period T2, the first and second voltages V1' and V2' may be represented by the following equations.

$$V1\_2' = V{sig} + \text{Leak2} + \text{Noise2} \qquad \text{Equation 9}$$

$$V2\_2' = \text{Leak1} + \text{Noise2} \qquad \text{Equation 10}$$

Here, V1_2' denotes the first voltage V1' supplied from the current-integrating unit 163' during the second period T2, and V2_2' denotes the second voltage V2' supplied from the current-integrating unit 163' during the second period T2.

The voltage V1_2' is charged in the third capacitor C3', and the voltage V2_2' is charged in the fourth capacitor C4'.

Subsequently, the fifth and sixth switches SW5' and SW6' are turned on during the third period T3. When the plurality of capacitors C1' to C4' have the same capacitance, a third voltage V3 charged in the third capacitor C3' after the third period T3 is the same as that represented by Equation 5, and a fourth voltage V4 charged in the fourth capacitor C4' is the same as that represented by Equation 6.

The differential amplifier DA supplies the voltage difference between the third and fourth voltages V3 and V4 to the comparison unit 167 as the signal voltage Vsig. Specifically, in response to a gain control signal GC, the differential amplifier DA amplifies the voltage difference between the third and fourth voltages V3 and V4, and supplies the amplified voltage difference to the comparison unit 167 as the signal voltage Vsig.

The noise-removing circuit 165' may further include a plurality of voltage buffers VB1 and VB2. The first voltage buffer VB1 buffers the third voltage V3 charged in the third capacitor C3', and supplies the buffered third voltage V3 to a first input terminal of the differential amplifier DA. The second voltage buffer VB2 buffers the fourth voltage V4 charged in the fourth capacitor C4', and supplies the buffered fourth voltage V4 to a second input terminal of the differential amplifier DA.

The noise-removing circuit 165' may further include a signal-crossing unit 166. The signal-crossing unit 166, in response to a sensing mode control signal SM, supplies any one of the third and fourth voltages V3 and V4 to the first voltage buffer VB1 or to the first input terminal of the differential amplifier DA, and supplies the other of the third and fourth voltages V3 and V4 to the second voltage buffer VB2 or to the second input terminal of the differential amplifier DA.

As described above, the embodiment described with reference to FIGS. 6 to 9 has the substantially same effect as the embodiment described with reference to FIGS. 2 to 5.

Although it has been described in this specification that the noise removing unit 165 or 165' and the sensing unit 160 sense current supplied from the pixel 150 of the organic light emitting display device 100, the technical spirit of the present invention is not limited thereto.

By way of summation and review, the related art organic light emitting display device might not display a uniform image as a pixel is degraded. The related art organic light emitting display device senses current supplied from the pixel to display a more uniform image, and converts externally supplied data according to the sensed current, thereby compensating for the degradation of the pixel. In this case, the current supplied from the pixel includes not only a signal element for sensing, but also various noise elements caused by leakage current, etc. As the accuracy of current sensing is lowered by the noise elements, the accuracy of degradation compensation of the pixel may be lowered.

In the noise-removing circuit and the current-sensing unit including the same according to embodiments of the present invention, it is possible to extract a signal element in isolation by removing a noise element.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims, and their equivalents.

What is claimed is:

1. A current-sensing unit comprising:
    a selection unit configured to respectively couple two data lines among a plurality of data lines to a first sensing line and a second sensing line in response to a line selection signal;
    a current-integrating unit configured to generate a first voltage by integrating a first current supplied from the first sensing line, and configured to generate a second voltage by integrating a second current supplied through the second sensing line;
    a noise-removing circuit configured to output a signal voltage having noise removed therefrom by using the first and second voltages; and
    a comparison unit configured to compare the signal voltage with a reference voltage, and configured to output a corresponding comparison result signal.

2. The current-sensing unit of claim 1, wherein the two data lines comprise adjacent data lines.

3. The current-sensing unit of claim 1, wherein the two data lines are coupled to pixels emitting a same color.

4. The current-sensing unit of claim 1, wherein the current-integrating unit comprises:
    a first current integrator configured to generate the first voltage by integrating the first current; and
    a second current integrator configured to generate the second voltage by integrating the second current.

5. The current-sensing unit of claim 4, wherein each of the first and second current integrators adjusts amplitudes of the first and second voltages by adjusting internal capacitance in response to a capacitance control signal.

6. The current-sensing unit of claim 1, wherein the noise-removing circuit comprises:
    a first capacitor configured to charge the first voltage during a first period in which a first switching control signal is supplied;
    a second capacitor configured to charge the second voltage during the first period;
    a third capacitor configured to charge the first voltage during a second period in which a second switching control signal is supplied, and configured to charge the second voltage charged in the second capacitor as a third voltage during a third period in which a third switching control signal is supplied;
    a fourth capacitor configured to charge the second voltage during the second period, and configured to charge the first voltage charged in the first capacitor as a fourth voltage during the third period; and
    a differential amplifier configured to output a voltage difference between the third voltage charged in the third capacitor and the fourth voltage charged in the fourth capacitor.

7. The current-sensing unit of claim 6, wherein the noise-removing circuit further comprises:

a first voltage buffer configured to buffer the third voltage charged in the third capacitor, and configured to supply the buffered third voltage to a first input terminal of the differential amplifier; and a second voltage buffer configured to buffer the fourth voltage charged in the fourth capacitor, and configured to supply the buffered fourth voltage to a second input terminal of the differential amplifier.

* * * * *